(12) United States Patent
Micovic et al.

(10) Patent No.: US 9,252,247 B1
(45) Date of Patent: Feb. 2, 2016

(54) APPARATUS AND METHOD FOR REDUCING THE INTERFACE RESISTANCE IN GAN HETEROJUNCTION FETS

(71) Applicant: HRL Laboratories, LLC, Malibu, CA (US)

(72) Inventors: Miroslav Micovic, Thousand Oaks, CA (US); Andrea Corrion, Thousand Oaks, CA (US); Keisuke Shinohara, Thousand Oaks, CA (US); Peter J Willadsen, Thousand Oaks, CA (US); Shawn D Burnham, Oxnard, CA (US); Hooman Kazemi, Thousand Oaks, CA (US); Paul B Hashimoto, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/151,979

(22) Filed: Jan. 10, 2014

Related U.S. Application Data

(62) Division of application No. 12/792,529, filed on Jun. 2, 2010, now Pat. No. 8,686,473.

(51) Int. Cl.
*H01L 29/739* (2006.01)
*H01L 21/338* (2006.01)
*H01L 29/66* (2006.01)

(52) U.S. Cl.
CPC ............................ *H01L 29/66916* (2013.01)

(58) Field of Classification Search
None
See application file for complete search history.

(56) References Cited

U.S. PATENT DOCUMENTS

| 2008/0128753 A1* | 6/2008 | Parikh et al. ................. 257/194 |
| 2008/0173898 A1* | 7/2008 | Ohmaki ........................ 257/194 |

* cited by examiner

*Primary Examiner* — Fernando L Toledo
*Assistant Examiner* — Valerie N Newton
(74) *Attorney, Agent, or Firm* — George R. Rapacki; Albert T. Wu

(57) ABSTRACT

The interface resistance between the source/drain and gate of an HFET may be significantly reduced by engineering the bandgap of the 2DEG outside a gate region such that the charge density is substantially increased. The resistance may be further reduced by using an n+GaN Cap layer over the channel layer and barrier layer such that a horizontal surface of the barrier layer beyond the gate region is covered by the n+GaN Cap layer. This technique is applicable to depletion and enhancement mode HFETs.

15 Claims, 6 Drawing Sheets

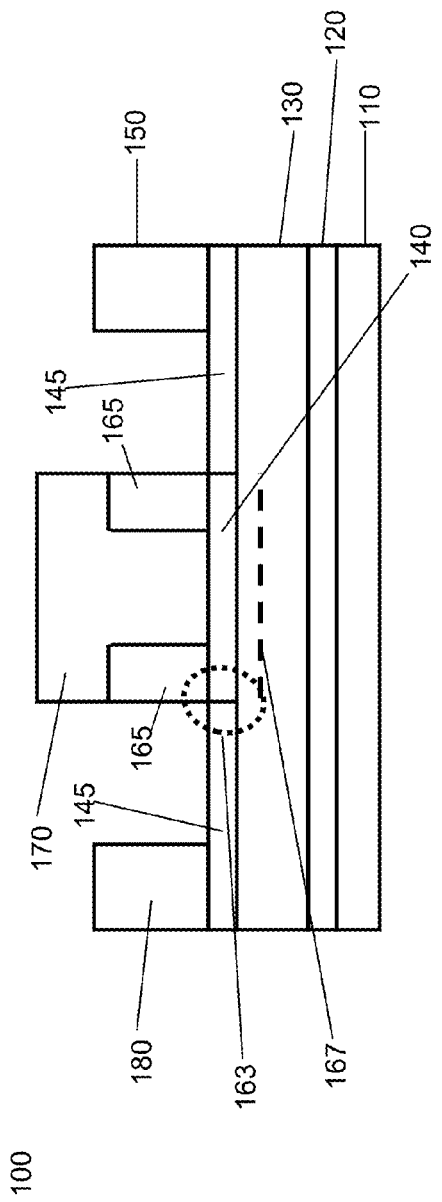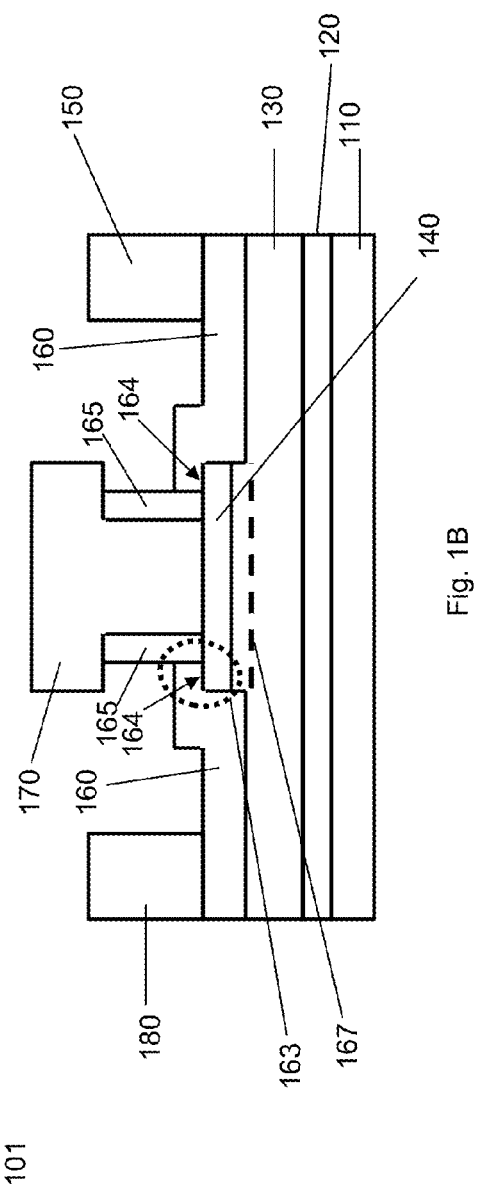
Fig. 1A
Fig. 1B

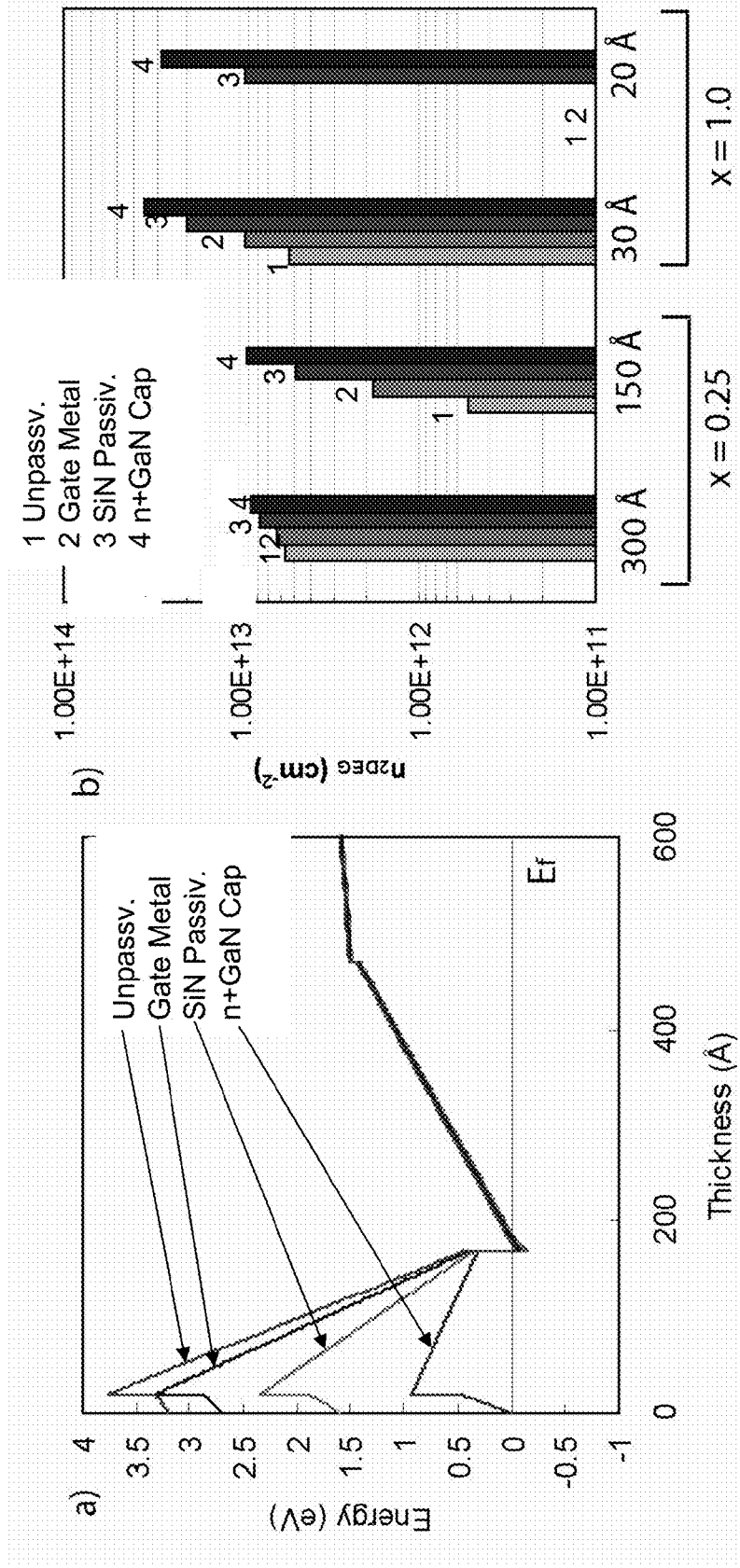

APPARATUS AND METHOD FOR REDUCING THE INTERFACE RESISTANCE IN GAN HETEROJUNCTION FETS

This application is a divisional application of, and claims priority to, Ser. No. 12/792,529 filed 2 June, 2010 titled "Apparatus and Method for Reducing the Interface Resistance in GaN Heterojunction FETs."

FIELD OF THE INVENTION

The present technology relates to a method and apparatus for reducing the resistance between the drain or source of Heterojunction Field Effect Transistor (HFET) and the two dimensional electron gas beneath the gate.

BACKGROUND OF THE INVENTION

Due to the resistive nature of wide bandgap materials, $AlXGa_{1-x}N$/GaN HFETs have historically suffered from high contact and access resistance, degrading high-frequency and power performance of these devices. Typically, ohmic contacts are made by annealing a Ti/Al-containing metal stack in order to drive metal through the wide bandgap Al-containing Barrier layer and contact the two-dimensional electron gas (2DEG) below. However, this approach has the disadvantages of inconsistent contact resistance, rough metal morphologies, and a lack of flexibility in device design. Ohmic contact regrowth, in which contact material is regrown after processing steps including masking and/or etching, has been explored as an alternative to this technique with limited success [1-4]. If successful, some advantages of ohmic contact regrowth would include: possible etching of the wide bandgap Al-containing Barrier layer in the contact regions, selective growth of bandgap-engineered or highly-doped material for ultra-low contact resistance and electric field profile modification, greater flexibility in device design and scaling such as reducing the effective source-drain distance for improved high-frequency performance, and the possibility of using non-alloyed metal contact stacks.

In "Low-resistance Ohmic contacts for high-power GaN field-effect transistors obtained by selective area growth using plasma-assisted molecular beam epitaxy", by S. J. Hong and K. Kim, (Appl. Phys. Lett. 89 042101 (2006)), the authors describe using selective area growth of a n+ doped GaN cap layer on the channel layer as a way to reduce the contact resistance. The present technology differs from Hong, et. al. in that Hong does not regrow the n+GaN on top of the barrier layer in the gate region. As a result, there is no bandgap engineering of the 2DEG below the exposed barrier layer near the gate.

In "High-transconductance self-aligned AlGaN/GaN modulation-doped field-effect transistors with regrown ohmic contacts", by C. H. Chen, S. Keller, G. Parish, R. Vetury, P. Kozokoy, E. L. Hu, S. P. DenBaars, and U. K. Mishra, (Appl. Phys. Lett. 73 3147 (1998)) the authors regrew n+GaN on the exposed channel layer but not on top of the barrier layer as in the present technology.

Devices processed using the previous approaches, in which n+GaN was regrown in the contact regions generally resulted in relatively high contact and access resistances. An annealing step subsequent to disposing the source or drain contact will not substantially affect the resistance between the source/drain and the channel layer.

SUMMARY OF THE INVENTION

Group III-Nitride wurtzite semiconductors are useful for fabricating Heterojunction Field Effect Transistors because when used in a (Gallium) polar orientation a two dimensional electron gas (2DEG) may be engineered in below the gate region. The ability to engineer the 2DEG below the gate region may be exploited to improve the device's interface resistance. Bandgap engineering is particularly useful for GaN devices although the techniques and technology herein are applicable to other Group III-Nitride compositions.

The problems of high resistance between the source/drain contact and the two dimensional electron gas (2DEG) in the gate region of a field effect transistor is at least partially solved by exposing the Barrier Layer on at least one side of the gate then regrowing a doped Cap layer of crystalline doped Group III-Nitride on the device, including the exposed Barrier Layer. The Barrier layer is exposed outside the gate region to form a ledge. By bandgap engineering through the use of particular thicknesses and compositions of the Barrier Layer and the doped Cap layer, the 2DEG charge density can be increased in the interface area between the source/drain contacts and the channel layer while not substantially perturbing the charge density below the gate. The result is significantly reduced interface resistance between the source/drain and the channel layer, even for enhancement mode devices.

Preferred characteristics of the doped Cap layer are a material of n+GaN with a doping greater than $7 \times 10^{19}$ per $cm^3$, and a thickness chosen to increase the charge density in the two dimensional electron gas at the interface between the source/drain and the two dimensional electron gas.

In one embodiment, the invention is an HFET device with reduced resistance comprising a substrate, a channel layer disposed on the substrate and a first contact disposed on the channel layer; and a barrier layer disposed on the channel layer such that a gate region is defined. This embodiment comprises a gate contact disposed on the barrier layer such that a portion of the barrier layer between the gate contact and the first contact is not covered by the gate contact and forms an exposed ledge of the barrier layer. In addition, the portion of the channel layer below the exposed ledge of the barrier layer defines an interface and there is a regrown cap layer disposed on the channel layer and on the exposed ledge of the barrier layer such that a charge density in the interface is greater than an alternate charge density without the regrown cap layer.

In other embodiments, the previous embodiment where the regrown cap layer is doped to a concentration greater than $2 \times 10^{13}$ per $cm^2$, the thickness of the channel layer below the gate region is greater than the thickness of the channel layer not below the gate region, the channel layer comprises GaN and barrier layer comprises AlGaN, the exposed ledge has a width of 20 to 500 nm, a cap layer may be disposed on the barrier layer, the exposed ledge of the barrier layer is delta doped, the delta doped exposed ledge of the barrier layer comprises silicon to a concentration of $2 \times 10^{13}$ per $cm^2$.

In another embodiment, an HFET device with reduced resistance comprising: a substrate, a channel layer disposed on the substrate and a first contact disposed on the channel layer; a barrier layer disposed on the channel layer such that a gate region is defined; a gate contact disposed on the barrier layer such that a portion of the barrier layer between the gate contact and the first contact is not covered by the gate contact and forms an exposed ledge of the barrier layer; wherein the portion of the channel layer below the exposed ledge of the barrier layer defines an interface; and means for increasing a charge density in the interface. The previous embodiment wherein the channel layer further comprises GaN, the barrier layer further comprises a cap layer, or the cap layer further comprises a dielectric layer.

In another embodiment, the invention is a method of reducing the interface resistance in an HFET device, the method comprising: forming a device comprising a substrate, a channel layer, a barrier layer, a gate and a gate region; exposing a portion of the barrier layer in the gate region to form a ledge; regrowing a cap layer on the channel layer and the exposed ledge of the barrier layer; forming a gate, source and drain on the device. Another embodiment comprises the previous embodiment where the method further comprises thinning the channel layer outside the gate region or cleaning the exposed ledge of the barrier layer, or cleaning of the exposed ledge with hydrogen.

In another embodiment, the invention is a method of reducing the interface resistance in an HFET device, the method comprising: forming a device comprising a substrate, a channel layer, a barrier layer, a gate and a gate region; exposing a portion of the barrier layer in the gate region to form a ledge; engineering a charge density below the exposed ledge of the barrier layer such that the charge density below the exposed ledge of the barrier layer is greater than the charge density not below the exposed ledge of the barrier layer; forming a gate, source and drain on the device whereby engineering the charge density below the exposed ledge of the barrier layer is defined to mean selecting the materials, composition and thicknesses of the barrier layer.

In another embodiment, the method of the previous embodiment further comprising: a step of cleaning the exposed ledge of the barrier layer before engineering the charge density below the exposed ledge of the barrier layer, or the channel layer comprises GaN and the barrier layer comprises AlGaN, or wherein the step of engineering the charge density below the exposed ledge of the barrier layer further comprises regrowing a cap layer on the exposed ledge of the barrier layer, or a step of disposing a cap layer on the barrier layer after exposing a portion of the barrier layer, wherein the regrown cap layer comprises n+GaN.

BRIEF DESCRIPTION OF THE DRAWINGS

The accompanying drawings, together with the specification, illustrate exemplary embodiments of the present technology, and, together with the description, serve to explain the principles of the present technology.

FIG. 1A shows an HFET as known in the art.

FIG. 1B shows an HFET embodying the technology.

FIG. 5A shows the bandgap of four structures illustrating the advantages of the present technology.

FIG. 5B shows the charge density in the 2DEG at the interface between the Barrier layer and the figures use similar numbers for the same components of the technology. For example Barrier layer 130 in FIG. 1 is the same as Barrier layer 330 in FIG. 3.

DETAILED DESCRIPTION

Figure 1C:
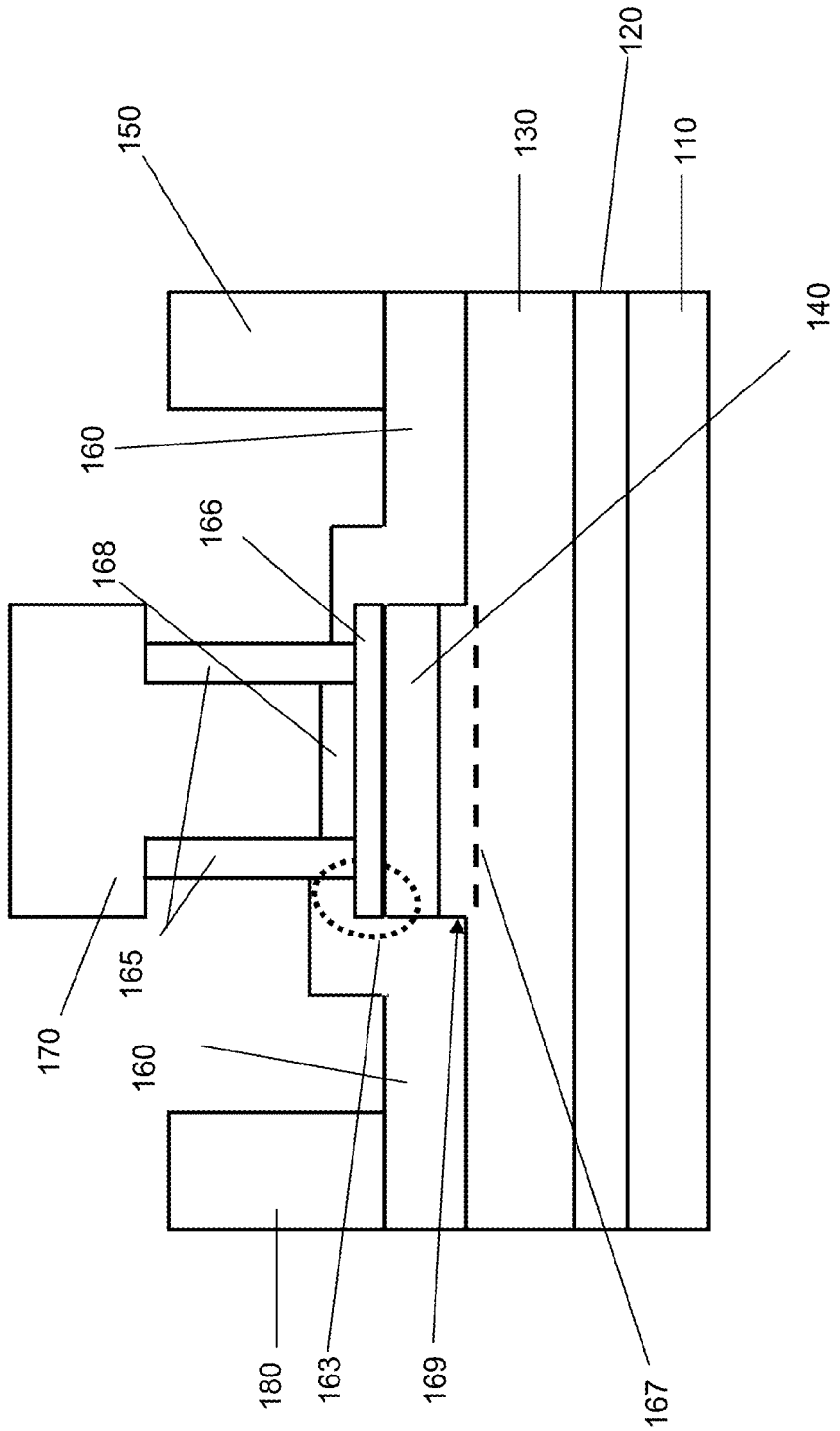
FIG. 1C shows an alternative embodiment of the technology where the exposure of the barrier also thins the barrier layer outside the gate region.

The following papers are incorporated by reference as though fully set forth herein:

[1] C. H. Chen, S. Keller, G. Parish, R. Vetury, P. Kozokoy, E. L. Hu, S. P. DenBaars, and U. K. Mishra, "High-transconductance self-aligned AlGaN/GaN modulation-doped field-effect transistors with regrown ohmic contacts", Appl. Phys. Lett. 73 3147 (1998).

[2] H. Kawai, M. Hara, F. Nakamura, and S. Imanaga, "AlN/GaN insulated gate heterostructure FET with regrown n+GaN ohmic contact", Electronics Lett. 34 592 (1998).

[3] S. Heikman, S. Keller, S. P. DenBaars, and U. K. Mishra, "Mass transport regrowth of GaN for ohmic contacts to AlGaN/GaN", Appl. Phys. Lett. 78 2876 2001.

[4] S. J. Hong and K. Kim, "Low-resistance Ohmic contacts for high-power GaN field-effect transistors obtained by selective area growth using plasma-assisted molecular beam epitaxy", Appl. Phys. Lett. 89 042101 (2006).

[5] J. S. Moon, D. Wong, M. Hu, P. Hashimoto, M. Antcliffe, C. McGuire, M. Micovic, and P. Willadson, "55% PAE and High Power Ka-Band GaN HEMTs With Linearized Transconductance via n+GaN Source Contact Ledge", IEEE Electron Device Letters, Vol 29, No. 8, August 2008.

In the following detailed description, only certain exemplary embodiments of the present technology are shown and described, by way of illustration. As those skilled in the art would recognize, the described exemplary embodiments may be modified in various ways, all without departing from the spirit or scope of the present technology. Accordingly, the drawings and description are to be regarded as illustrative in nature, and not restrictive.

The present technology reduces the interface resistance between a source or drain contact and the two dimensional electron gas below the gate through a GaN Ohmic Regrowth and Extension (GORE) technique. Compare FIG. 1A with FIG. 1B. FIG. 1A shows a prior art structure for a depletion mode (D-mode) or enhancement mode (E-mode) device 100. The device 100 comprises a Substrate 110, an optional Buffer layer 120, and a Channel Layer 130. The character of the device 100 (enhancement mode or depletion mode) is determined by the charge density in the 2DEG (two dimensional electronic gas) 167 between the Barrier layer 140 and Channel Layer 130. The choice of thickness and composition of the Barrier layer is part of the bandgap engineering to produce the 2DEG 167 below the gate 170. Note that in FIG. 1A the boundary between the Source/Drain region 150/180 and the Channel layer 130 in the region 163 does not overlap with the 2DEG 167 below the gate nor is the Channel layer 130 thinned outside the gate region.

FIG. 1B of the device 101 of the present technology is similar to FIG. 1A except in the region 163 and the effect on the 2DEG 167 in that region. The bandgap engineering of the 2DEG 167 may include adding particular thicknesses of a Cap layer 145. The Cap layer 145 may be doped to reduce the resistance between the source/drain regions 150/180 and the channel layer 130. By cutting back or etching back the sidewall/passivation layer 165 the Barrier Layer 140 is at least partially exposed. The Cap layer 160 may be regrown to a thickness in the region 163 such that the charge density in the 2DEG 167 in the region 163 is increased. The increased available charge carriers in the 2DEG 167 in the region 163 reduces the interface resistance $R_{Interface}$ between the Source/Drain region 150/180 and the channel 130. This interface resistance is further reduced by the n+ doping of the Cap layer 160 to form a Doped Cap Layer 160. In one preferred embodiment of this technology the surface 164 of the exposed ledge in the region 163 may be further doped with silicon in a process known as Silicon Delta Doping prior to adding the GaN cap layer. Details of the silicon doping (also known as modulation doping) are described in pending patent application "Doped Channel GaN Double Heterojunction Field Effect Transistor" by Miroslav Micovic and Adam Conway, application Ser. No. 11/396,366 filed Mar. 31, 2006 and incorporated by reference in its entirety as though fully set forth herein.

The GaN Cap layer 145 is preferably created by molecular beam epitaxy (MBE) to control the number of atomic layers built. This is preferable to starting with a thick layer and then using a dry or wet etch process to thin the Cap layer 145 to the necessary thickness because a "build up" approach allows for greater control of the built up layers than achievable through wet etching.

Preferred embodiments for the device 101 in FIG. 1B include a SiC substrate 110, an optional buffer layer 120 of $Al_XGa_{1-X}N$ where X is approximately 0.04 and the buffer layer is approximately 500 nm, a channel layer 130 of GaN approximately 40 nm thick and a Barrier layer 140 comprising $Al_XGa_{1-X}N$ where X is approximately 0.25 and the layer is 2.5 to 25 nm thick. Other thicknesses are possible based on the intended operation of the device 101 (E-Mode or D-Mode) as determined through bandgap engineering of the device 101.

FIG. 1C shows an alternate embodiment of the present technology. This is similar to that shown in FIG. 1B but with an added Cap Layer 166 and an optional dielectric layer 168 in the gate region. The Cap layer 166 may be GaN and is part of the bandgap engineering of the 2DEG 167. In addition, the etching to expose the Cap Layer 166 may result in a thinning of the Channel Layer 130 and exposure of the Barrier Layer 140. This may create a vertical edge 169 on the Channel layer 130 at the gate. When the Doped Cap Layer 160 is added, the $R_{interface}$ is reduced if the vertical edge 169 is smoothed first. The vertical edge 169 may be smoothed through hydrogen cleaning or wet etching or other techniques known in the art. The Channel layer 130 may be doped to further reduce the resistance as described in "Doped Channel GaN DHFET", application Ser. No. 11/396,366 filed Mar. 31, 2006. Depending on the characteristics of the Cap Layer 166 and the bandgap engineering, the 2DEG 167 may allow for depletion mode operation.

Preferred embodiments for the device 102 in FIG. 1C include a SiC substrate 110, an optional buffer layer 120 of $Al_XGa_{1-X}N$ where X is approximately 0.04 and the buffer layer is approximately 500 nm, a channel layer 130 of GaN approximately 40 nm thick, a Barrier layer 140 comprising $Al_XGa_{1-X}N$ where X is approximately 0.25 and the layer is 2.5 to 25 nm thick and a GaN Cap Layer 166 approximately 2.5 nm thick. Other thicknesses are possible based on the intended operation of the device 102 (E-Mode or D-Mode) as determined through bandgap engineering of the device 102. Device 102 has an exposed horizontal surface of the GaN Cap layer 166 in the region 163 produced by the removal of passivation or masking layers not shown in FIG. 1C. This ledge or exposed surface of the GaN Cap Layer 166 in the region 163 is deliberate. By exposing the Cap Layer 166 in FIG. 1C or the barrier layer 140 in FIG. 1B, the Doped Cap Layer 160 may be used to increase the charge density at the interface with the Channel layer 130. This increased charge density at the interface is understood as being responsible for the reduced $R_{Interface}$ of devices 101 and 102.

Without implying a limitation, regrowth of the Doped Cap layer 160 may be accomplished by Molecular Beam Epitaxy (MBE) or Metal Organic Chemical Vapor Deposition (MOCVD) or other techniques know in the art.

The following table show preferred embodiments of the present technology for the device shown in FIG. 1B.

| Layer | Composition | Thickness |
|---|---|---|
| 110 | Silicon Carbide | varies |
| 120 | $Al_{0.04}Ga_{0.96}N$ | 100 to 500 nm |
| 130 | GaN | 20 to 40 nm |
| 140 | $Al_{0.25}Ga_{0.75}N$ | Varies with the composition and device function |
| 160 | n+GaN | 20 to 100 nm |

The following table show preferred embodiments of the present technology for the device shown in FIG. 1C.

| Layer | Composition | Thickness |
|---|---|---|
| 110 | Silicon Carbide | varies |
| 120 | $Al_{0.04}Ga_{0.96}N$ | 100 to 500 nm |
| 130 | GaN | 20 to 40 nm |
| 140 | $Al_{0.25}Ga_{0.75}N$ | 2.0 to 500 nm |
| 160 | n+GaN | 20 to 100 nm |
| 166 | GaN | 2.0 to 500 nm |
| 168 | Dielectric | varies |

Figure 2:
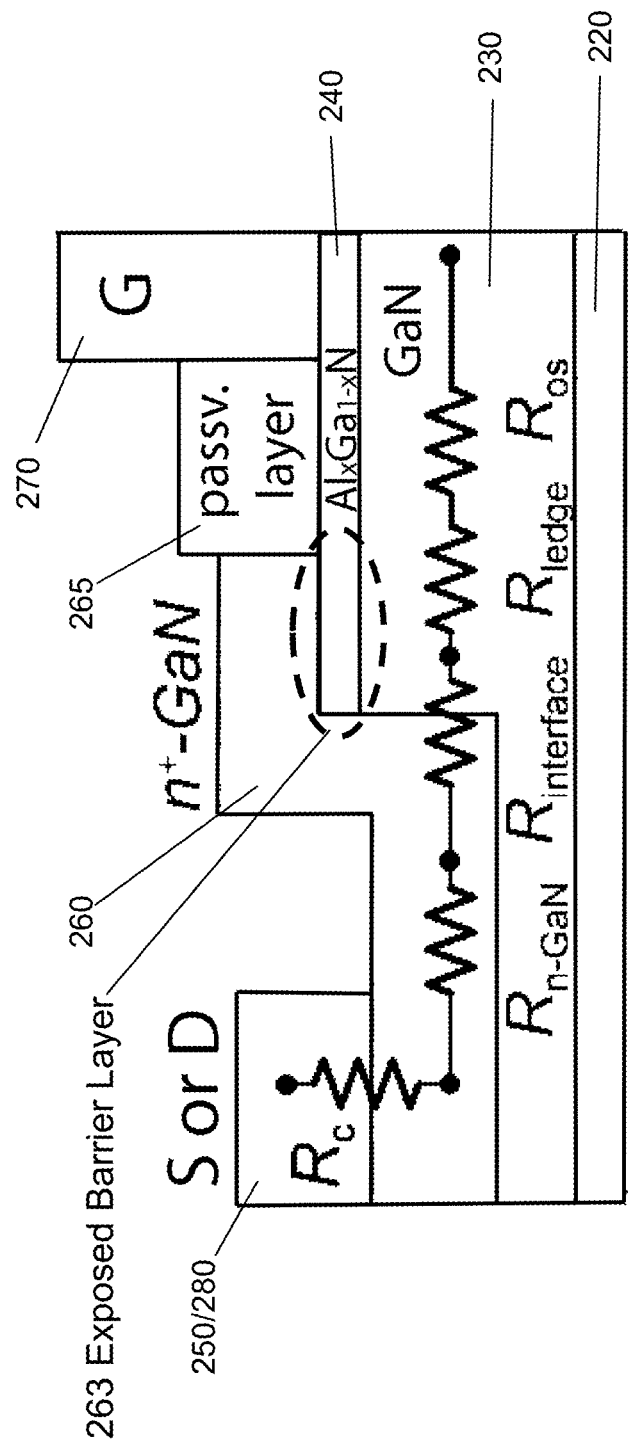
FIG. 2 shows a schematic of the present technology and identifying the interface in question.

In FIG. 2 the various components of the resistance between the Source/Drain 250/280 and the Channel layer 230 are shown. Of the components shown, the overlap of the Doped Cap layer 260 over the Barrier layer 240 in the region 263 has an unexpected affect on the interface resistance, $R_{INTERFACE}$.

FIGS. 3A-F show the preferred process steps in creating the technology described here. The reader skilled in the art will realize not all the steps necessary are shown and variations on these steps are possible while still preserving the technology described herein In FIG. 3A, one starts with a Substrate 310, an optional Buffer layer 320 and a Channel layer 330. A Barrier layer 340 of $Al_XGa_{1-X}N$ $0 \le X \le 1$ is formed in the gate region. A filler 372 is used to hold the place of the gate metal. SiN sidewalls 365 and SiO2 mask 375 may be added or are the final result of intermediate steps not shown here. If the sidewalls are SiN while the mask is SiO2 then etchants may be hydrogen fluoride or buffered oxide etchant. Alternatively, sidewall 365 may be formed of SiO2 while the mask may be of SiN. This alternative changes the etchant used to boiling phosphoric acid.

Figure 3A:
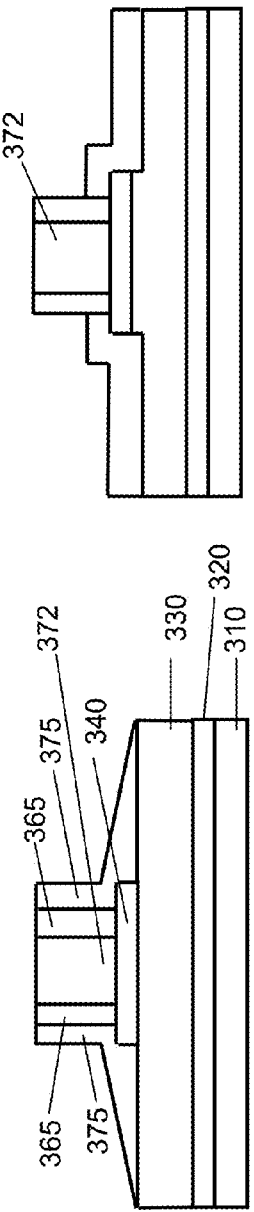
FIGS. 3A-3F illustrates a method of constructing the present technology.
Figure 3B:
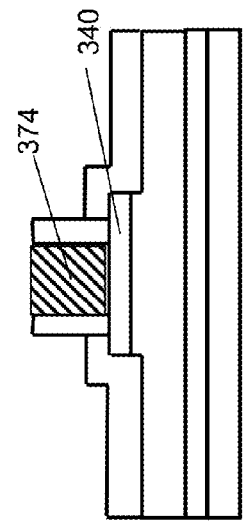
Figure 3C:
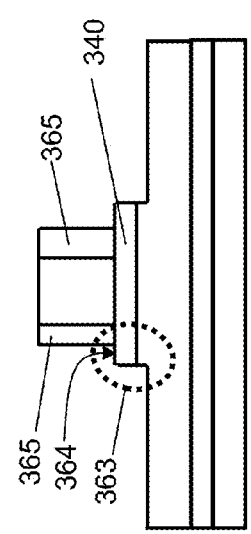
Figure 3D:
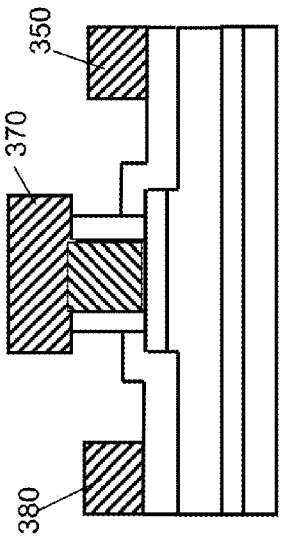

In FIG. 3B the mask 375 is removed through selective wet etch using Buffered Oxide etchant (for a SiO2 mask), HF or other techniques known in the art. This exposes the Barrier layer 340 in the region 363 to form a ledge for a width beyond the gate region. This horizontal exposed surface 364 of the Barrier layer 340 beyond the gate is preferably between 20 nm and 500 nm with 260 nm preferred. In FIG. 3C a Doped Cap layer 360 is regrown, in one embodiment, of n+ doped GaN. Regrowth of the Doped Cap layer 360 may be accomplished through molecular beam epitaxy (MBE) and metal organic chemical vapor deposition (MOCVD). If MBE is used to regrow the Barrier Layer or Cap layer then regrowth may be in increments of a single monolayer of the regrowth material. For GaN materials the regrowth layer increment may be as little as 0.26 nm thick. The thickness of the Doped Cap layer 360 over the exposed Barrier layer 340 is engineered to increase the charge density in the underlying 2DEG. The thickness of a n+GaN Doped Cap layer 360 is preferably between 20 and 100 nm. The specific thickness of the Doped Cap Layer 360 is engineered to provide an increased charge density in the 2DEG below the gate at the interface between the Barrier Layer 340 and the Channel Layer 330, i.e. in the region 363. If the Doped Cap Layer 360 is GaN then the regrowth of the Doped Cap layer 360 results in formation of polycrystalline GaN 355 in regions such as on top of the Gate 372.

Figure 3E:
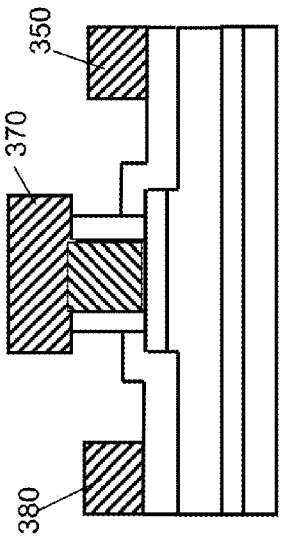

In FIG. 3C the polycrystalline GaN 355 (or other material left over from the regrowth process) is removed, by way of example and not limitation, through a wet etch process. The gate filler 372 shown in FIG. 3D, which may be silicon, may be removed through a sacrificial wet etch process. A metal plating operation is then used to form the gate metal 374, as shown in FIG. 3E. The gate metal may be platinum or nickel or other suitable metals known to those in the art. The plating could be electroless or using a metal seed deposited by sputtering, plasma assisted atomic layer deposition or chemical vapor deposition.

Figure 3F:
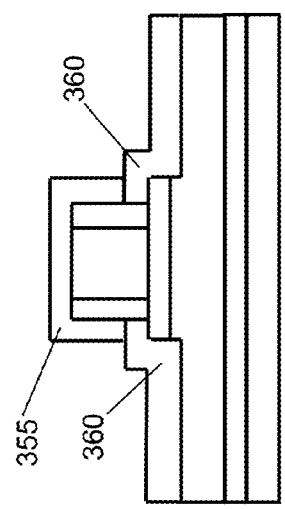

Finally, in FIG. 3F the device is completed by adding the Source, Drain and Gate Head plating 380, 350 and 370 respectively. An alternative method of making the Gate 374 and Gate Head 370 may be used by depositing nickel or platinum over a silicon filler 372 then annealing to form NiSi or PtSi.

An alternative embodiment of the present technology resulting in reduced interface resistance includes, by way of example and not limitation, includes intentionally roughening the exposed horizontal surface 364 of the Barrier layer 340 in the region 363. Other alternatives include treating the horizontal surface 364 of the exposed Barrier layer 340 through wet chemical etching, Si delta doping or hydrogen cleaning before regrowth of the Doped Cap layer 360.

In one embodiment the Channel layer 330 may be exposed and thinned with a dry etch process when the Barrier layer 340 is exposed. Since the dry etch process may damage the Channel Layer 330, the dry etch process may be followed by a wet etch process to clean and smooth the vertical edge of the exposed Channel Layer 330 as well as the vertical edge of the exposed Barrier Layer 340. Ammonia diluted in a 10:1 ration may be used as a chemical etchant although diluted KOH may be used also. The process may be further refined by using a photo assisted wet chemical etch.

The exposed ledge 364 of the Barrier Layer 340 may be doped in the region 363 as indicated by the arrow in FIG. 3B to reduce the interface resistance between the Source/Drain 350/380 and the Channel layer 330. The exposed ledge 364 of the Barrier Layer 340 may be delta doped with silicon to a concentration of $2 \times 10^{13}$ to $10^{14}$ per $cm^2$ by MBE or other techniques know in the art.

In one embodiment, an optional additional step may be added after the Barrier layer 340 is exposed to use hydrogen cleaning prior to the regrowth of the Doped Cap Layer 360. The hydrogen cleaning is accomplished by using hydrogen in a Reactive Ion System etching step or by using an in situ thermally cracked atomic hydrogen source or hydrogen plasma in an MBE apparatus.

In an alternative embodiment, the Channel Layer 330 may be topped with a Barrier Layer 340 and a Cap Layer. The Cap Layer is not shown in FIG. 3 but shown as 166 in FIG. 1C. This may necessitate a Dielectric layer 168 between the Cap Layer 166 and the Gate 170 in FIG. 1C.

The sidewall 365 may include a passivation layer between the gate 372 and the barrier layer 340.

Figure 4:
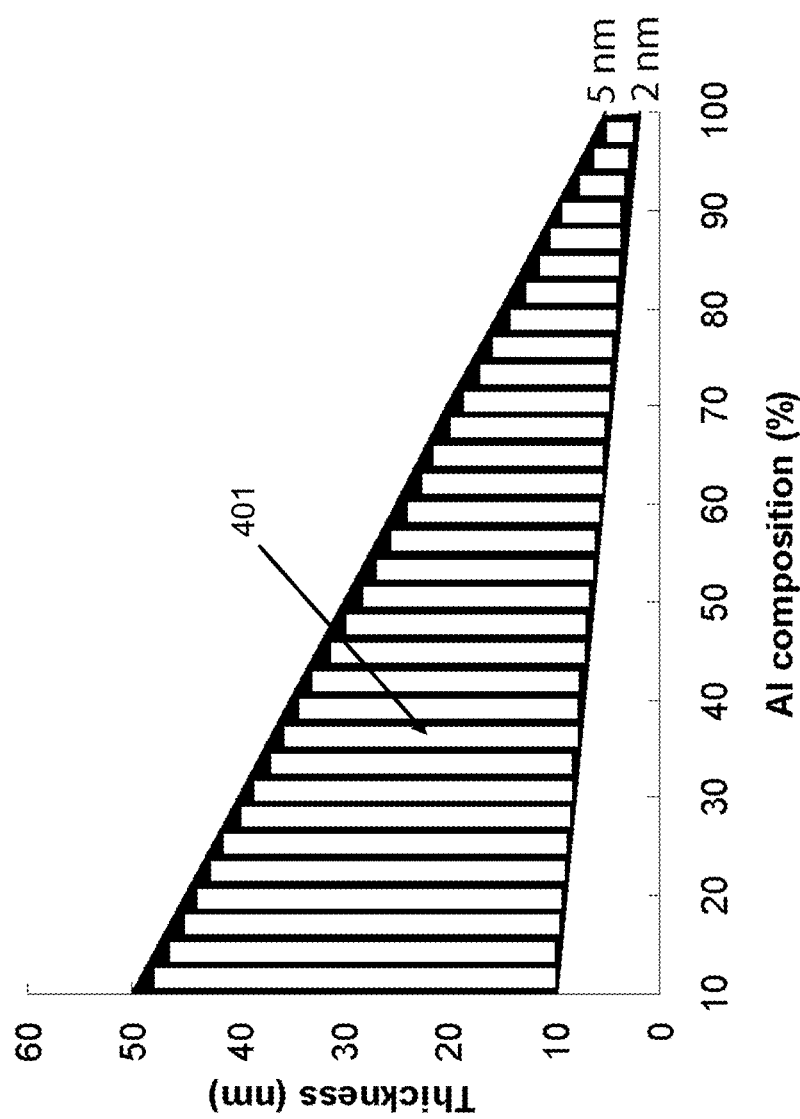
FIG. 4 shows the range of barrier layer thickness and composition consistent with the present technology.

FIG. 4 shows the range of Barrier layer 340 thicknesses in nanometers and compositions for this technology as the striped area 401. This striped area 401 is defined by two straight lines, Thickness in nanometers is approximately $-40/45*X+10\%$ and thickness is approximately $-0.5*X+55$ where X is the percentage composition of the AlXGa$_{1-X}$N Barrier layer 340 and Thickness is the thickness of the Barrier layer 340 in nanometers. These two lines define the boundary of the barrier composition and thickness for preferred embodiments of this technology. The specific composition and thickness will depend on the desired operation of the device, E-Mode or D-Mode, and the desired thickness of the n+GaN Doped Cap layer 360. The corresponding n+GaN Doped Cap layer 360 thickness over the Barrier layer 340 is 20-100 nm. The doping level of the n+GaN Doped Cap layer 360 is $10^{19}$ per $cm^3$ to $10^{20}$ per $cm^3$. In one preferred embodiment the dopant is silicon.

FIG. 5A shows the calculated conduction band profiles for Al$_X$Ga$_{1-X}$N/GaN HFETs with varying surface terminations and FIG. 5B shows the calculated 2DEG densities for Al$_X$Ga$_{1-X}$N/GaN HFETs with varying: surface terminations such as none (unpassivated), metal gate, SiN passivated and a n+GaN cap, Al$_X$Ga$_{1-X}$N Barrier layer compositions (X), and Al$_X$Ga$_{1-X}$N Barrier layer thicknesses. The surface barrier heights in FIG. 5A were calculated to be 3.2, 2.7, 1.6, and 0 eV for Unpassivated, Gated Metal, SiN passivated, and n+GaN Doped Cap terminated surfaces, respectively.

FIG. 5B shows the charge density in the 2DEG as a result of bandgap engineering through the choice of Barrier layer 340 and n+GaN Doped Cap layer 360 composition and thickness. Significantly, the charge density for the 3 nm Barrier layer 340, where X is approximately 1.0 for the AlN composition (column 4) was $3.2 \times 10^{13}$ per $cm^2$ while the charge density for the same composition but without the Cap layer 360 (column 1) was less than $5 \times 10^{12}$ per $cm^2$ for a factor of six increase in charge density. The increase is a factor of 280 for the 2 nm thick Barrier layer, X is approximately 1.0, (column 4) over the unpassivated surface termination (column 1).

The epitaxial structures used were typical polarization-doped double-heterojunction Al$_X$Ga$_{1-X}$N/GaN field-effect transistors. The structure in 5A comprised 20 Å GaN Cap Layer 360, 150 Å Al$_{0.25}$Ga$_{0.75}$N Barrier layer 340, 300 Å GaN Channel 330, and Al$_{0.04}$Ga$_{0.96}$N Buffer layer 320. The epi structure in 5B comprised 20 Å GaN Cap 360, variable composition (X is approximately 0.25, 1.0) and thickness (20 Å, 30 Å, 150 Å and 300 Å), Al$_X$Ga$_{1-X}$N/GaN Barrier layers 340, 300 Å GaN channel 330, and Al$_{0.04}$Ga$_{0.96}$N buffer layer 320. The calculated 2DEG densities in FIG. 5B for composition X is approximately 1.0 and thickness of 20 Å for unpassivated and gate-metal passivated surfaces (columns 1 and 2) were less than $10^{11}$ per $cm^2$ and are not shown. FIGS. 5A and B illustrate using an n+GaN cap (column 4 in FIG. 5B) gives the greatest increase in charge density and hence the greatest reduction in interface resistance between the Channel layer and the Source/Drain.

An alternative epi structure comprising 500 Å n+GaN regrowth Cap layer 160 on an AlN/GaN Barrier layer 140 with a GaN Channel 130 and Al$_{0.04}$Ga$_{0.96}$N buffer layer 120, not shown, had an access resistance of 0.11 Ω-mm.

As used herein, the term "Group III-nitride" refers to those semiconducting compounds formed between Nitrogen and the elements in Group III of the periodic table, usually Aluminum (Al), Gallium (Ga), and or Indium (In). The term also refers to ternary and quaternary compounds, such as AlGaN, InGaN, and AlInGaN. As well understood by those in this art, the Group III elements can combine with Nitrogen to form binary (e.g., GaN), ternary (e.g., AlGaN and AlInN), and quaternary (e.g., AlInGaN) compounds. The embodiments of the technology described above are generally based on a Substrate 110 of silicon carbide. Other substrate materials are possible such as AlN, GaN, Si, Lithium Niobate and Boron Nitride. Alternative Channel Layer 130, Barrier Layer 140, and Cap layer 160 materials include the Group III-nitride materials described above.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A method of reducing the interface resistance in an HFET device, the method comprising:
    forming a device comprising a substrate, a channel layer, a barrier layer, a gate and a gate region;
    exposing a portion of the barrier layer in the gate region to form a ledge;
    forming a doped cap layer on the channel layer and the ledge of the barrier layer, wherein the doped cap layer is formed such that a downward projection of the doped cap layer would intersect with the ledge;
    forming a gate, source and drain on the device.

2. The method of claim 1 further comprising:
    thinning the channel layer outside the gate region.

3. The method of claim 1 further comprising:
    cleaning the exposed ledge of the barrier layer.

4. The method of claim 1 further comprising:
    wherein the cleaning of the exposed ledge is accomplished with hydrogen.

5. The method of claim 1, wherein the doped cap layer comprises n+GaN.

6. The method of claim 1, wherein the doped cap layer comprises a material that engineers the charge density below the exposed ledge of the barrier layer.

7. The method of claim 1, wherein the doped cap layer on the channel layer and the exposed ledge of the barrier layer are connected.

8. The method of claim 6, wherein the doped cap layer is engineered such that the charge density below the ledge of the barrier layer is increased.

9. The method of claim 1, wherein the doped cap layer is formed on a top surface of the ledge of the barrier layer.

10. A method of reducing the interface resistance in an HFET device, the method comprising:
    forming a device comprising a substrate, a channel layer, a barrier layer, a gate and a gate region;
    exposing a portion of the barrier layer in the gate region to form a ledge;
    engineering a charge density below the exposed ledge of the barrier layer such that the charge density below the exposed ledge of the barrier layer is greater than the charge density not below the exposed ledge of the barrier layer;
    forming a gate, source and drain on the device
    whereby engineering the charge density below the exposed ledge of the barrier layer is defined to mean selecting the materials, composition and thicknesses of the barrier layer.

11. The method of claim 10 further comprising a step of cleaning the exposed ledge of the barrier layer before engineering the charge density below the exposed ledge of the barrier layer.

12. The method of claim 10 wherein the channel layer comprises GaN and the barrier layer comprises AlGaN.

13. The method of claim 10 wherein the step of engineering the charge density below the exposed ledge of the barrier layer further comprises regrowing a cap layer on the exposed ledge of the barrier layer.

14. The method of claim 10 further comprising a step of disposing a cap layer on the barrier layer after exposing a portion of the barrier layer.

15. The method of claim 13 wherein the regrown cap layer comprises n+GaN.

* * * * *